United States Patent [19]

Wynn

[11] 4,447,792
[45] May 8, 1984

[54] SYNTHESIZER CIRCUIT

[75] Inventor: Stephen R. Wynn, Lynchburg, Va.

[73] Assignee: General Electric Company, Lynchburg, Va.

[21] Appl. No.: 319,139

[22] Filed: Nov. 9, 1981

[51] Int. Cl.$^3$ .............................................. H03C 3/06
[52] U.S. Cl. ...................................... 332/19; 331/18; 455/76; 455/260
[58] Field of Search .......................... 307/271; 328/14; 331/18, 23, 46, DIG. 2; 332/16 R, 19; 455/76, 165, 183, 196, 208, 260

[56] References Cited

U.S. PATENT DOCUMENTS 3,622,913  11/1971  Shipley ................................... 332/16
4,027,274   5/1977  Fukui et al. ............................ 332/19
4,320,357   3/1982  Wulfsberg et al. .................... 332/19
4,347,484   8/1982  Vandegraf ............................. 331/18

*Primary Examiner*—John Zazworsky
*Attorney, Agent, or Firm*—James J. Williams

[57] ABSTRACT

A frequency synthesizer utilizing a phased locked loop is provided with input modulating signals for the reference oscillator and for the voltage controlled oscillator. Where the frequency of the reference oscillator must be divided, a time delay circuit between the input modulating signal and the voltage controlled oscillator is provided in order to eliminate or appreciably reduce deviation magnitude responsive distortion with respect to input modulating frequencies.

10 Claims, 2 Drawing Figures

SYNTHESIZER CIRCUIT

BACKGROUND OF THE INVENTION

My invention relates to frequency synthesizers using a phase locked loop, and particularly to such frequency synthesizers having modulation applied to both the reference oscillator and the voltage controlled oscillator.

In some frequency synthesizers using a phase locked loop, the modulation frequencies must cover the range of a few Hz up to several thousand Hz. An example is in a radio transmitter which is frequency modulated with low frequency signalling tones (20 Hz for example) and with higher frequency voice signals (such as 200 to 3000 Hz). Such synthesizers using a phased lock loop are known in the art, one example being U.S. Pat. No. 3,622,913 granted Nov. 23, 1971. In such prior art synthesizers, the modulated reference oscillator output is applied directly to the phase detector, and satisfactory operation is provided. However, where the modulated reference oscillator frequency must be divided to a lower frequency, a phase shift or time delay is introduced to the divided oscillator frequency which is applied to the phase detector. This presents a real problem in that the reference oscillator is usually crystal controlled and normally has an output in the MHz range for stability. This output must be divided by a factor of 1,000 or more before being applied to the phase detector. The divider circuit introduces significant time delay. However, in the prior art synthesizers, the modulated voltage controlled oscillator output is not subjected to an effective time delay, even though this output is multiplied or divided before being applied to the phase detector. Thus, the time difference between the modulated reference oscillator signal applied to the phase detector and the modulation signal applied to the voltage controlled oscillator causes significant distortion in the voltage controlled oscillator output from the phase locked loop.

SUMMARY OF THE INVENTION

Briefly, my invention provides an improved frequency synthesizer circuit that uses a phase locked loop. Modulation signals are applied to frequency modulate a reference oscillator whose output is frequency divided and applied to one input of a phase detector. The output of the phase detector is filtered and applied to one input of a voltage controlled oscillator. The output of the voltage controlled oscillator is supplied to a utilization circuit, and is also multiplied or divided and applied to the other input of the phase detector. Modulation signals are also applied through a time delay circuit to a second input of the voltage controlled oscillator to frequency modulate this voltage controlled oscillator. The time delay circuit is either adjustable or is permanently set to introduce the same time delay as that delay introduced by the divider between the reference oscillator output and the phase detector input, and thereby reduces the distortion or improper operation that would otherwise result as in prior art frequency synthesizers.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF A PREFERRED EMBODIMENT

Figure 1:
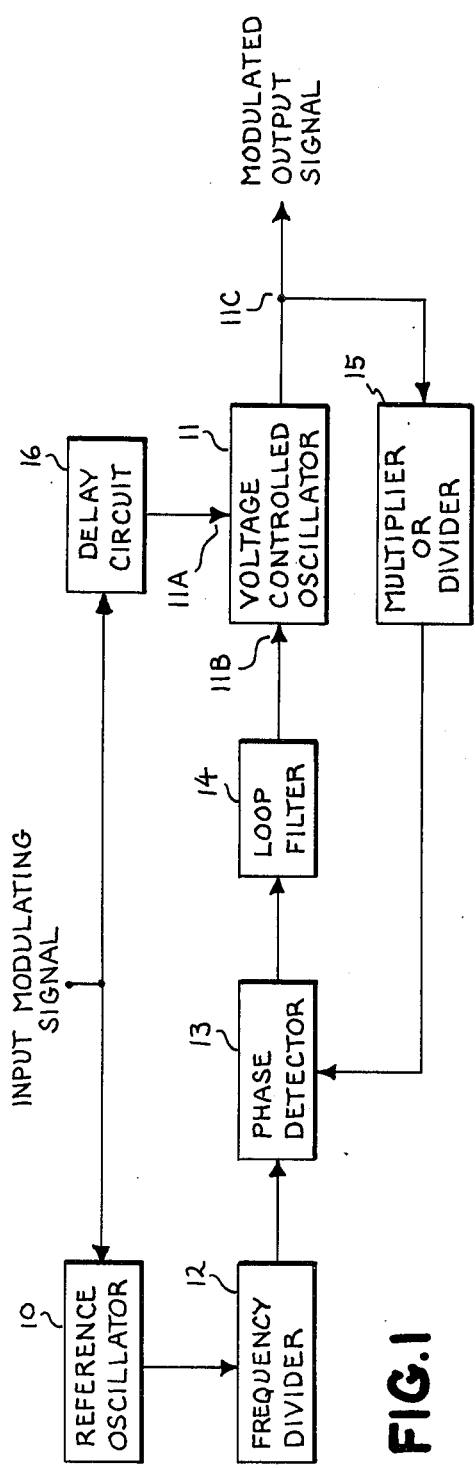
FIG. 1 shows a block diagram of a preferred embodiment of a frequency synthesizer in accordance with my invention.

FIG. 1 shows a block schematic diagram of a frequency synthesizer in accordance with my invention. In such a synthesizer it is necessary that the input modulating signal be applied to a reference oscillator 10 and to a voltage control oscillator 11. This necessity arises if, as is often the case, the input modulating signals include relatively low frequency tone signals, in the order of 10 to 200 Hz for example, and include voice modulating signals, in the order of 200 to 3000 Hz for example. As is known in the synthesizer art, the modulating signals are applied to one frequency control or modulating input 11A of the voltage controlled oscillator 11 to avoid the high frequency limitations of the loop filter when only the reference oscillator 10 is modulated. As is also known the modulating signals are applied to the reference oscillator 10 to avoid the low frequency limitations of the voltage controlled oscillator 11. The reference oscillator 10 is typically a crystal controlled oscillator whose fundamental oscillating frequency is often in the order of tens of MHz for stability reasons. To operate in the synthesizer, its frequency must be reduced by a frequency divider 12. The reduced frequency signals are applied to one input of a phase detector 13. The output of the phase detector 13 is applied to a loop filter 14 whose output is applied to a second frequency control or modulating input 11B of the voltage controlled oscillator 11. The output 11C of the voltage controlled oscillator 11 is derived and utilized in any way desired, such as in a radio transmitter. The output of the oscillator 11 is also applied to a multiplier or divider 15 whose output is applied to the other input of the phase detector 13. The circuit as described thus far is known in the art, utilizing conventional or well-known circuit elements for each of the blocks described.

Figure 2:
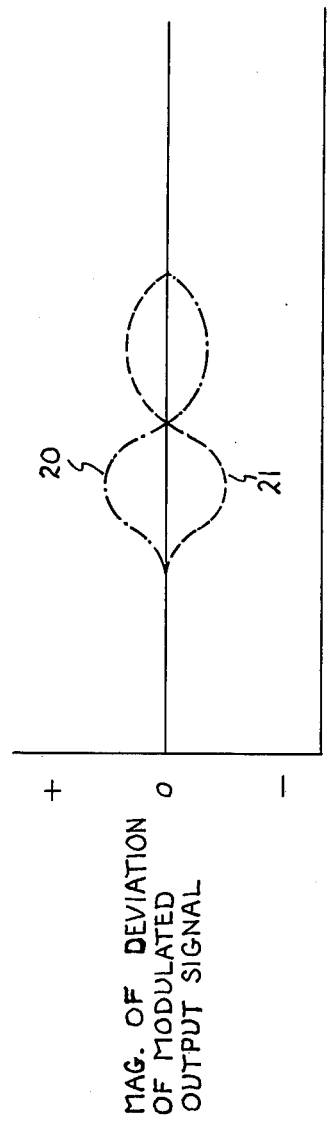
FIG. 2 shows curves for illustrating the operation of my invention.

The frequency divider 12 introduces a significant phase shift or time delay to signals produced by the reference oscillator 10. I have found that this time delay introduces deviation magnitude distortion of the modulated output signal as a function of the input modulating signal frequency. This deviation is illustrated by the dashed and dotted line curve 20 and the dashed line curve 21 shown in FIG. 2. The distortion results in part from the fact that the frequency synthesizer is basically a negative feedback loop, and the modulating signals applied to the voltage controlled oscillator 11 and to the phase detector input from the divider 12 should be in phase or have the same time relation to provide a substantially flat output frequency response to modulation. If the reference oscillator and voltage controlled oscillator deviations at the output 11C are equal in both magnitude and phase, the deviation magnitude frequency response will be flat or zero as shown by the solid line curve of FIG. 2. However, if the phase of the modulated reference oscillator output signal lags the phase of the modulating signal applied to the input 11A of the voltage controlled oscillator 11, the deviation shown by the dashed and dotted line 20 is the result.

Conversely, if the phase of the modulating signal applied to the input 11A of the voltage control oscillating 11 lags the phase of the modulated reference oscillator output signal applied to the phase detector 13, then the dashed line deviation 21 results. Accordingly, I have found that these phase deviations can be corrected by inserting a time delay circuit 16 in series between the input modulating signal and its input 11A to the voltage control oscillator 11 to provide the flat solid line curve of FIG. 2. The time delay circuit 16 may take a number of forms, including: a lossless transmission line of suitable length; a bucket brigade delay line or charged coupled delay line; a slow wave propagation medium such as a surface accoustic wave device; or a synthesized time delay circuit having operational amplifiers; or passive circuit elements connected to provide a time delay circuit. These and other delay circuits are known to persons skilled in the art, and, depending upon the exact needs or demands of the synthesizer, can be used in accordance with my invention. Also, it is possible to make the time delay of the delay circuit 16 adjustable in some instances.

While I have shown only one embodiment of my invention, persons skilled in the art will appreciate the many modifications that may be made. Thus, all of the blocks or basic circuit elements shown in FIG. 1 may take various forms, depending upon the availability and design requirements. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved frequency synthesizer comprising:
 a. a source of modulating signals;
 b. a reference oscillator;
 c. a frequency divider coupled to said reference oscillator;
 d. a phase locked loop including a phase comparing circuit and a voltage controlled oscillator coupled thereto;
 e. means coupling the output of said frequency divider to said phase comparing circuit;
 f. a time delay circuit coupled to said voltage controlled oscillator;
 g. and means coupling said source of modulating signals to said reference oscillator and to said time delay circuit for modulating said reference oscillator without appreciable time delay, and for modulating said voltage controlled oscillator after said time delay.

2. The improved frequency synthesizer of claim 1 wherein said time delay circuit introduces a time delay substantially equal to the time delay introduced by said reference frequency divider.

3. A phase locked loop frequency modulator comprising:
 a. a first controlled oscillator having a first input and a second input and an output, said first oscillator providing at said output a signal having a frequency dependent upon signals applied to said inputs;
 b. a second controlled oscillator having an input and an output, said second oscillator providing at said output a signal having a frequency dependent upon signals applied to said input;
 c. means for applying a modulating signal to said input of said second controlled oscillator;
 d. a time delay circuit coupled to said first input of said first controlled oscillator;
 e. means for applying said modulating signal to said time delay circuit;
 f. comparing means for comparing said first controlled oscillator output signal with said second controlled oscillator output signal and providing a control signal dependent upon the output signals from said first and second controlled oscillators;
 g. and means for applying said control signal provided by said comparing means to said second input of said first controlled oscillator.

4. The phase locked loop frequency modulator of claim 3, and further comprising frequency dividing means coupled between said output of said second controlled oscillator and said comparing means.

5. The phase locked loop frequency modulator of claim 4 wherein the time delay of said time delay circuit and the time delay of said frequency dividing means are substantially equal.

6. The phase locked loop frequency modulator of claim 3 or claim 4 or claim 5 wherein said first controlled oscillator includes a voltage controlled oscillator and wherein said second controlled oscillator includes a voltage controlled crystal oscillator.

7. The improved combination comprising:
 a. a first voltage controlled oscillator having two inputs and an output;
 b. a second voltage controlled oscillator having an input and an output;
 c. a phase comparing circuit having two inputs and an output;
 d. first means for coupling said output of said first voltage controlled oscillator to one of said phase comparing circuit inputs;
 e. second means for coupling said output of said second voltage controlled oscillator to the other of said phase comparing circuit inputs;
 f. third means for coupling said output of said phase comparing circuit to one input of said first voltage controlled oscillator;
 g. fourth means for applying a modulating voltage to said input of said second voltage controlled oscillator; and
 h. fifth means for applying a delayed modulating voltage to the other input of said first voltage controlled oscillator.

8. The combination of claim 7 wherein said second means includes a frequency divider circuit.

9. The combination of claim 8 wherein the time delay introduced by said fifth means is substantially equal to a time delay introduced by said second means.

10. The combination of claim 7 wherein said third means includes a low pass filter.

* * * * *